United States Patent [19]

Reynolds

[11] 3,714,597

[45] Jan. 30, 1973

[54] BROADBAND POWER AMPLIFIER WITH MULTIPLE STAGES CONNECTED BY BALUN TRANSFORMERS

[75] Inventor: Gary R. Reynolds, Streamwood, Ill.

[73] Assignee: Motorola, Inc., Franklin Park, Ill.

[22] Filed: Sept. 4, 1970

[21] Appl. No.: 69,532

[52] U.S. Cl. ......................330/14, 330/15, 330/116, 330/117, 330/122

[51] Int. Cl. ..............................................H03f 3/04

[58] Field of Search....330/14, 15, 27, 116, 117, 165, 330/188, 195, 122; 333/25

[56] References Cited

UNITED STATES PATENTS

| | | | |
|---|---|---|---|
| 3,290,653 | 12/1966 | Slattery et al | 333/25 X |
| 3,437,948 | 4/1969 | Simons | 330/28 |
| 3,154,750 | 10/1964 | David et al. | 330/14 |
| 3,185,933 | 5/1965 | Ehret | 330/165 X |
| 3,381,238 | 4/1968 | Barton et al. | 330/195 X |

*Primary Examiner*—Roy Lake
*Assistant Examiner*—Lawrence J. Dahl
*Attorney*—Mueller & Aichele

[57] ABSTRACT

Broadband power amplifier including a single ended stage coupled to a plurality of stages by use of balun transformers. Broadband operation is achieved by use of balun transformer having interwinding capacitance which forms a shunt element, and high power is provided by use of a plurality of stages contributing to the load. A first single ended stage may be coupled by a one-to-one balun to a pair of push-pull stages, which in turn may be coupled through balun transformer to two pair of push-pull transistor stages. Alternately the single ended stage can be connected by two balun transformers to two pair of push-pull stages, or may be connected by three or more balun transformers to a like number of single ended stages. The outputs can be combined by use of a plurality of balun transformers coupled in series and each providing impedance step-up or by use of transformers, to thereby provide the desired output impedance of the amplifier.

7 Claims, 5 Drawing Figures

Patented Jan. 30, 1973 3,714,597

2 Sheets-Sheet 1

Inventor
GARY R. REYNOLDS
BY Mueller and Aichele
ATTYS.

Inventor
GARY R. REYNOLDS
BY Mueller and Aichele
ATTYS.

BROADBAND POWER AMPLIFIER WITH MULTIPLE STAGES CONNECTED BY BALUN TRANSFORMERS

BACKGROUND OF THE INVENTION

Problems have been encountered in providing high power broadband transistor amplifiers operating at high frequencies, because the power level of individual high frequency transistors is low. The inter-coupling of a plurality of transistors to provide high power output has resulted in loss of power, as known circuits for connecting a plurality of transistors have not been particularly efficient. Because of the low impedance of transistors and other semi-conductor devices, it is difficult to obtain efficient coupling for wide band operation. Although direct coupling is effectively used for low power operation, this cannot be used when it is desired to combine the power outputs of a plurality of transistors.

Transformer coupled transistor stages have been used but must be carefully designed for operation over a wide bandwidth. This is because the stray reactance of the windings becomes a factor which tends to narrow the bandwidth. Further, transformer coupling of stages generally requires tuning and provisions must be made to balance the stages so that the load is divided substantially evenly therebetween.

SUMMARY OF THE INVENTION

It is an object of the present invention to provide an improved broadband high power transistor amplifier for use in a radio transmitter operating at high frequencies.

Another object is to provide an efficient coupling circuit for coupling a plurality of transistor stages so that the outputs thereof can be effectively combined to provide high power operation at high frequencies.

A further object of the invention is to provide a coupling system with low impedance coupling devices for matching the transistor stages, and which provides broadband operation and requires a minimum of adjustable elements for tuning.

In accordance with the invention, a high power transistor amplifier for use at high frequencies, of the order 150 to 170 megahertz, includes a plurality of transistor stages which are coupled to each other by balun transformers. The first driver stage may be a single ended transistor stage coupled through a one-to-one balun transformer to a pair of push-pull transistor stages. The balun transformer provides broadband low impedance coupling between these stages. The two push-pull stages may each be coupled through a balun transformer to two pair of push-pull transistor stages which provide the power output. These balun transformers may also have a one-to-one turns and impedance ratio providing low impedance broadband coupling. Alternately the output of the single ended stage can be applied to two pairs of push-pull stages in parallel by two balun transformers having a one-to-one ratio. The output of each push-pull pair may be coupled to a four-to-one step-up balun transformer, with the two output baluns connected in series to a matching circuit to provide the output impedance required. The power amplifier can be used in a radio transmitter and in such case the output will normally be connected to an antenna which may have an impedance of 50 ohms. Also, the output may be coupled through a coaxial line which has an impedance of 50 ohms. A single transistor stage may also be coupled to more than two single ended stages in parallel, as, for example, to three such stages by use of a like number of balun transformers, and the outputs of such stages can be combined to supply a load.

BRIEF DESCRIPTION OF THE DRAWINGS

Referring now to FIG. 1 of the drawing, this circuit illustrates a high-power amplifier for use in the 150 to 170 megacycle range, and which includes a pre-driver stage 10 having a transistor 12 as the active element. The input matching circuit shown is representative of known circuits which can be used. The output of the transistor amplifier is connected to output conductors 15 and 16, with the collector electrode of transistor 12 being connected through capacitor 14 to conductor 15, and the emitter electrode of transistor 12 directly connected to conductor 16.

Figures 1, 2, 3:
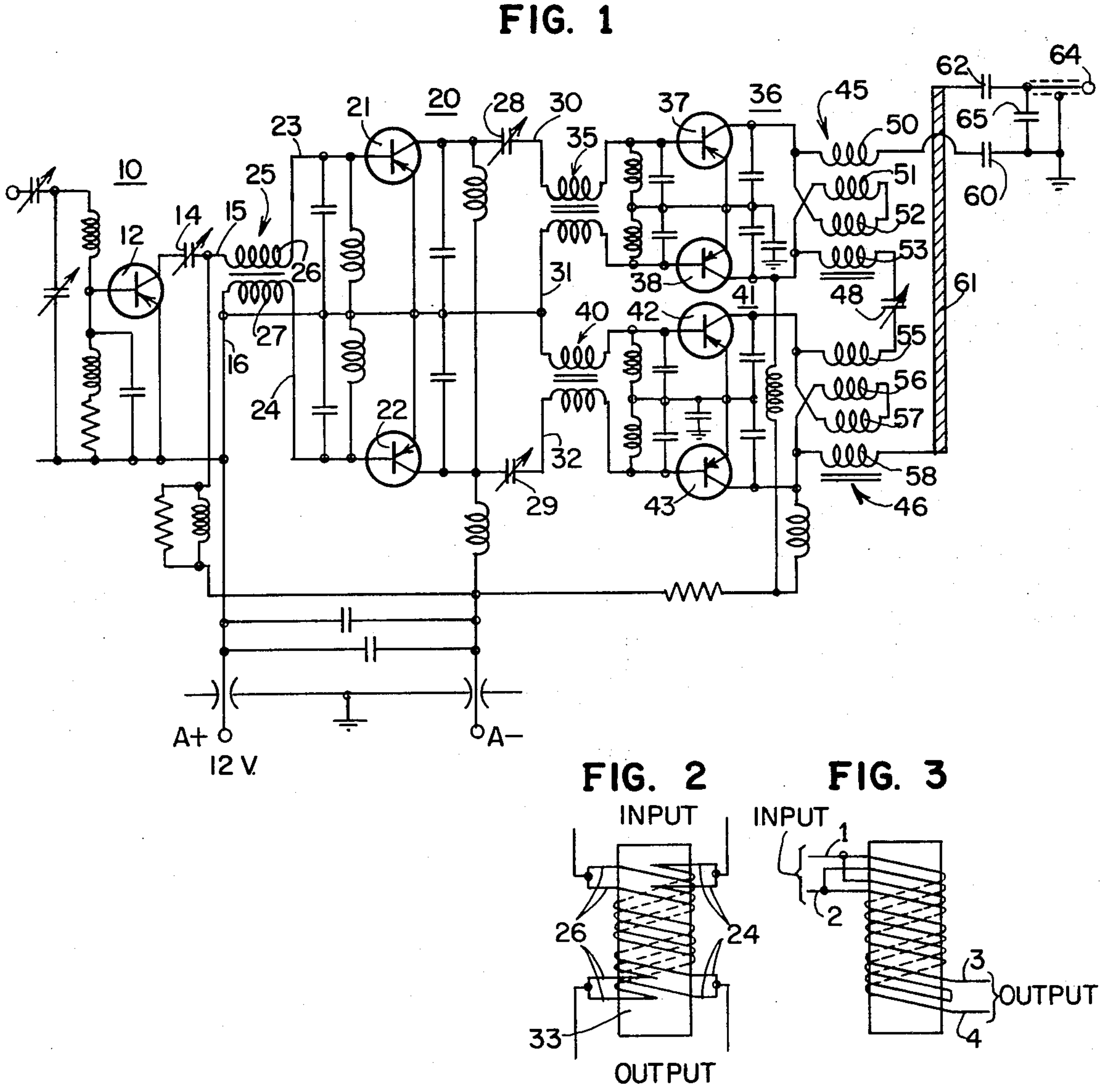
FIG. 1 is a circuit diagram of a power amplifier including transistor stages coupled by balun transformers.
FIG. 2 illustrates a one-to-one balun transformer.
FIG. 3 illustrates a four-to-one balun transformer.

The output of pre-driver amplifier 10 is connected to the input of driver amplifier 20, which is a push-pull amplifier including transistors 21 and 22. The input to the driver stage 20 is provided by conductors 23 and 24, which are connected to the base electrodes of the transistors 21 and 22 respectively. The output of amplifier 10 at conductor 15 is applied through winding 26 of balun transformer 25 to conductor 23 connected to the base of transistor 21. Similarly, the output conductor 16 of amplifier 10 is connected through winding 27 of balun transformer 25 to conductor 24, which is connected to the base of transistor 22. The connection is such that the signal on the base of transistor 22 is opposite in phase to the signal on the base of transistor 21. The balun transformer 25, therefore, couples the single ended stage 10 to the balanced or push-pull stages of amplifier 20.

The balun transformer 25 may be of the construction shown in FIG. 2 wherein the windings 26 and 27 are wound on a ferrite rod core 33. A ferrite toroid core may be used with equal results. Although in FIG. 2 each winding is shown as including two conductors in parallel, single or multiple conductors can be used if desired. The two or more parallel conductors provide greater coupling between the windings, which may be desired in certain applications.

The outputs of the two push-pull stages of driver amplifier 20 are derived between conductors 30 and 31, and between conductors 31 and 32. Each output is applied through a balun transformer to a push-pull amplifier section with the output between conductors 30 and 31 being applied through balun transformer 35 to the push-pull amplifier section 36, which includes transistors 37 and 38. The output between conductors 31 and 32 is applied through balun transformer 40 to the push-pull amplifier section 41, including transistors 42 and 43. The connection of the balun transformers coupling the push-pull stages of amplifier 20 to the amplifier sections 36 and 41 may be the same at that of balun transformer 25, which is shown in FIG. 2.

To match the output of the power amplifier stages 36 and 41, to a 50 ohm line, a pair of four-to-one balun transformers 45 and 46 are provided. The 50 ohm line may in turn be connected to a 50 ohm antenna. Transformer 45 includes windings 50, 51, 52 and 53, and transformer 46 includes windings 55, 56, 57 and 58. The windings on each transformer are wound on a single ferrite core and the arrangement may be as shown in FIG. 3. These balun transformers provide four-to-one impedance step-up so that the output impedance of each push-pull amplifier section, which may be of the order of 3 ohms, is increased to the value of 12 ohms. This increased impedance is provided by connecting the four windings of each transformer in series opposing relation in the output circuit.

The output circuit for the amplifier includes the four windings of transformer 45 coupled in series with variables capacitor 48, and in series with the four windings of transformer 46. Winding 50 is connected through capacitor 60 to ground, and winding 58 is connected to a conductive strip 61 which forms an inductor connected in series with capacitor 62 to the output terminal 64. Capacitor 65 is connected between the output terminal and ground. The network including inductor 61 and capacitors 60, 62 and 65, provide a further impedance step-up of two-to-one, so that the output impedance is of the order to 50 ohms.

It will be apparent from a consideration of FIG. 1 that the coupling balun transformers 25, 35 and 40 are connected in such a way that the distributed capacitance between the windings forms a shunt capacitance. This provides broadband tuning as desired. The capacitor 14 can be adjusted for aligning the coupling of pre-driver amplifier 10 to driver amplifier 20. Similarly, capacitors 28 and 29 are provided in series with balun transformers 35 and 40 to align the coupling between the driver stage 20 and the power amplifier stages 36 and 41.

Figure 4:
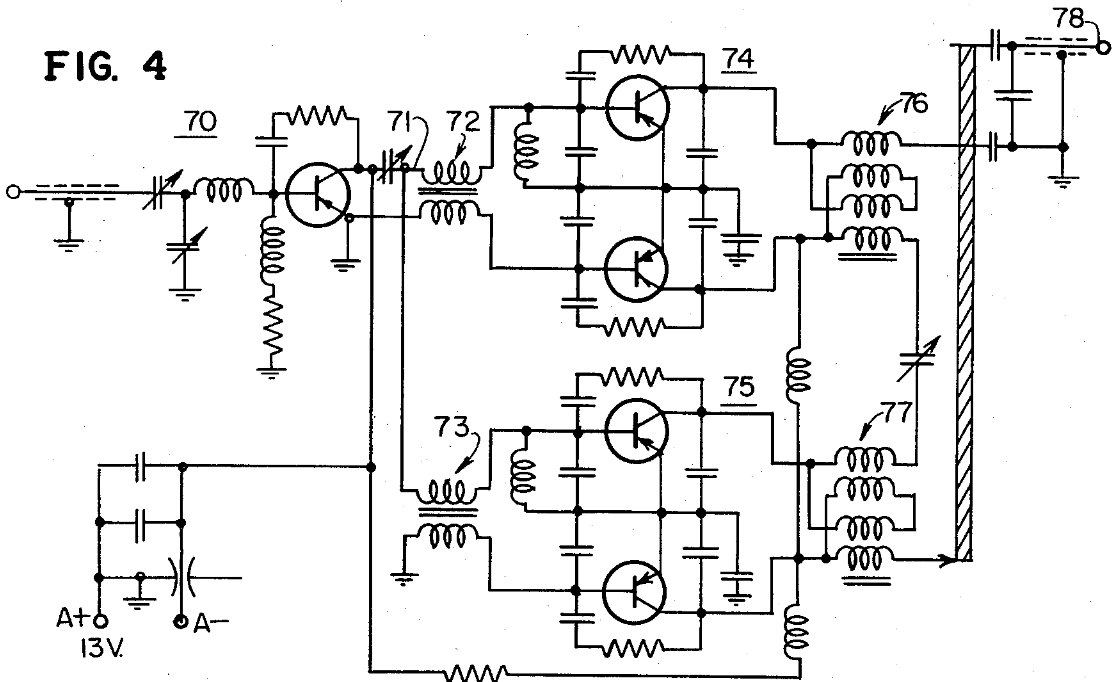
FIG. 4 is a circuit diagram of a second embodiment of the circuit of the invention.

In FIG. 4 there is shown an embodiment of the circuit of FIG. 1 wherein a single ended stage 70 is directly coupled through two balun transformers to two push-pull output amplifier sections 74 and 75. In FIG. 4, the driver amplifier 70 is generally similar to pre-driver amplifier 10 in the circuit of FIG. 1. In the circuit of FIG. 4, a feedback connection is provided from the collector to the base of the transistors, which is not shown in the circuit of FIG. 1. This provides negative feedback which suppresses regeneration and can be used in the same manner in the circuit of FIG. 1.

The output of driver stage 70 is derived between conductor 71 and ground and is applied in parallel to the two balun transformers 72 and 73. The balun transformer 72 applies signals to the push-pull section 74, and the balun transformer 73 applies signals to the push-pull section 75. These amplifier sections are generally equivalent to the sections 36 and 41 in the circuit of FIG. 1. The balun transformers 72 and 73 may be of the construction shown in FIG. 2.

The outputs of the two amplifier sections 74 and 75 are coupled through balun transformers 76 and 77 to the impedance matching output circuit providing signals at output terminal 78. The balun output transformers and the matching circuit connected thereto are the same as shown in FIG. 1. This provides proper impedance matching to a 50 ohm load, which may be a coaxial cable connected to an antenna. The balun transformer 76 and 77 may be of the construction shown in FIG. 3.

Figure 5:
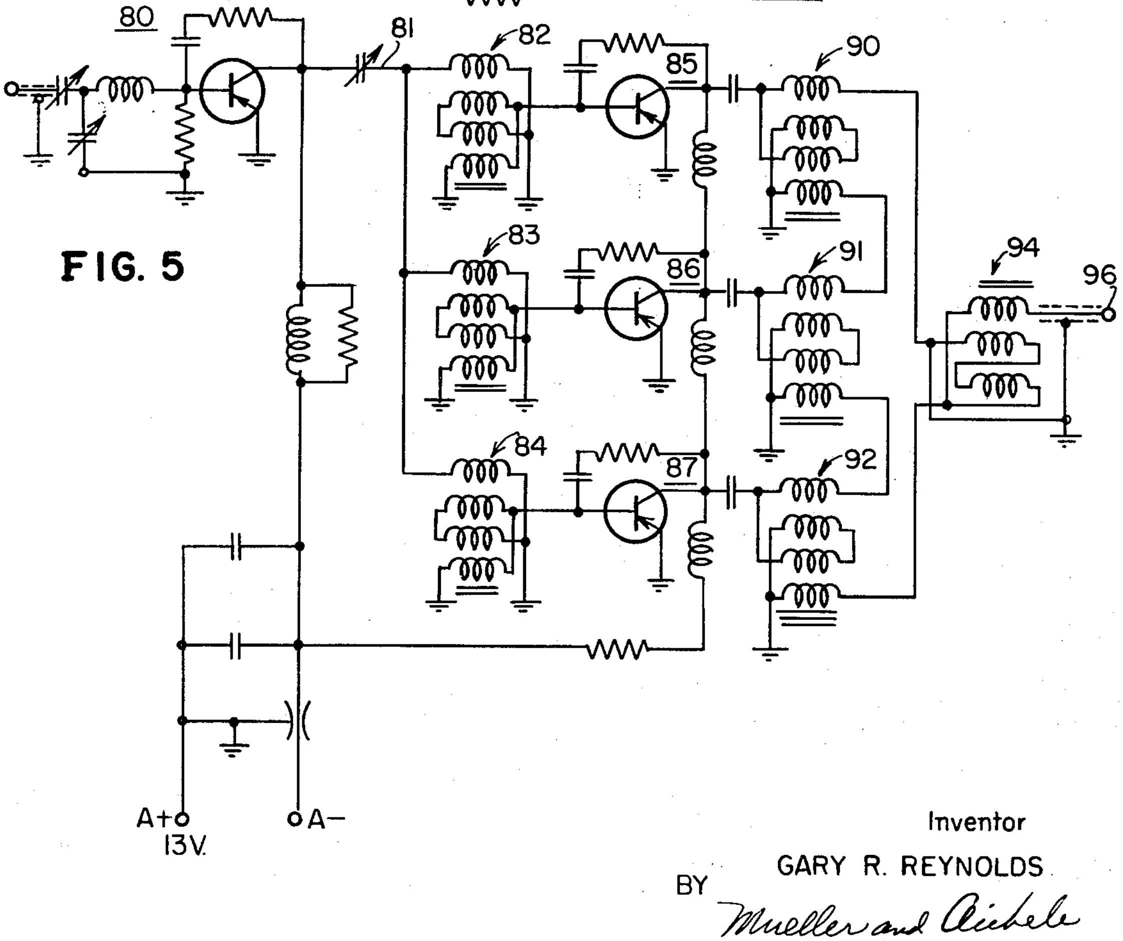
FIG. 5 is a circuit diagram of a further embodiment of the balun coupled transistor power amplifier of the invention.

A further embodiment of the balun connected broadband power amplifier is illustrated in FIG. 5. In this circuit the driver amplifier 80 is essentially the same as the driver amplifier in FIG. 4. The circuit uses PNP transistors and the positive side of the potential supply is shown at ground in FIG. 5, as in FIG. 4. If it is desired to use NPN transistors, the potential supply must be connected with the opposite polarity. The output of the driver amplifier is derived between output conductor 81 and ground. Connected to the output conductor 81 there are three, four-to-one balun transformers 82, 83 and 84. Each of these balun transformers may be of the construction shown in FIG. 3. It is pointed out, however, that the high impedance sides of the balun transformers are connected to the output of amplifier 80, and the low impedance sides are connected to the power amplifier stages 85, 86 and 87 driven thereby. This connection is used because the three balun transformers are connected in parallel to the output of the driver stage 80 so that the impedance presented thereby is reduced.

The balun transformer 82 drives single ended transistor power amplifier stage 85, the balun 83 drives transistor stage 86 and the balun 84 drives transistor stage 87. The outputs of the three transistor power amplifier stages are connected to an output circuit including four-to-one balun transformers 90, 91 and 92 connected to auto-transformer 94. Each of the balun transformers 90, 91 and 92 may also be constructed as shown in FIG. 3, with the low impedance sides connected to the power amplifier stages and the high impedance sides connected in series to the input of the auto-transformer 94. This coupling provides an impedance of the order of 23 ohms at the input of the transformer 94, which is stepped up by this transformer to about 50 ohms at the output terminal 96.

The output circuit including transformer 94 as shown in FIG. 4, can also be used in the circuits of FIGS. 1 and 4 in place of the output matching network shown in these circuits. The circuits which have been described using balun transformers connecting transistors stages provide high power broadband operation with a minimum of tuning controls. Single ended and push-pull stages can be interconnected and various numbers of stages can be used providing desired flexibility. The circuit may include a plurality of pairs of output stages which are isolated from each other to reduce wasted power caused by interaction between devices, and provides good device to device gain balance. As previously stated, the effect of interwinding reactance is reduced as this reactance appears as a shunt element in the circuit, with inherent broadband characteristics. The stray inductance of the output balun transformers appears in the output circuit as a series element, thus allowing reasonably long interconnections in the output circuit.

I claim:

1. A broadband power amplifier including in combination, a first transistor amplifier section having first and second output conductors and presenting a low output impedance, a second transistor amplifier section having first and second input conductors and presenting a low input impedance, said second transistor amplifier section including first and second push-pull connected transistors each having an input electrode, with said first and second input conductors being connected to said input electrodes of said first and second transistors, respectively, and balun coupling means including first and second inductively coupled windings on a single ferrite core, said first winding having a first end connected to said first output conductor and a second end connected to said first input conductor, and said second winding having a first end connected to said second output conductor and a second end connected to said second input conductor, said windings being constructed to couple signals from said output conductors of said first transistor amplifier section to said input conductors of said second transistor amplifier section and to match said input impedance of said second transistor amplifier section to said output impedance of said first transistor amplifier section.

2. The power amplifier of claim 1 wherein said first and second windings of said balun coupling means have the same number of turns for an one-to-one impedance ratio.

3. The power amplifier of claim 1 further including first and second additional push-pull transistor stages and first and second additional balun coupling means coupling said transistors of said second transistor amplifier section to said first and second additional push-pull transistor stages.

4. The power amplifier of claim 3 further including an output circuit for coupling the power amplifier to an output terminal, said output circuit including third and fourth additional balun coupling means connected to the outputs of said first and second additional transistor stages for increasing the output impedance.

5. The power amplifier of claim 4 wherein said third and fourth additional balun coupling means each include four inductively coupled windings, with such windings being connected in series opposition in the output circuit.

6. The power amplifier of claim 1 including a third transistor amplifier section having first and second input conductors and presenting a low input impedance, and additional balun coupling means including first and second coupled windings on a single ferrite core, said first winding of said additional balun coupling means having a first end connected to said first output conductor and a second end connected to said first input conductor of said third amplifier section, and said second winding of said additional balun coupling means having a first end connected to said second output conductor and a second end connected to said second input conductor of said third amplifier section.

7. The power amplifier of claim 6 further including an output circuit for coupling the power amplifier to an output terminal, said output circuit including first and second impedance step-up balun coupling means connected to the outputs of said second and third transistor amplifier sections for providing impedances in said output circuit greater than the output impedances of said second and third transistor amplifier sections.

* * * * *